(12) United States Patent
Miyake et al.

(10) Patent No.: US 6,656,592 B2
(45) Date of Patent: Dec. 2, 2003

(54) CARBON FILM AND METHOD OF FORMING THE SAME

(75) Inventors: Koji Miyake, Kyoto (JP); Yasuo Murakami, Kyoto (JP); Jo Takeuchi, Kyoto (JP); Takahiro Nakahigashi, Kyoto (JP); Kiyoshi Ogata, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 13 days.

(21) Appl. No.: 09/977,222

(22) Filed: Oct. 16, 2001

(65) Prior Publication Data

US 2002/0064658 A1 May 30, 2002

(30) Foreign Application Priority Data

Oct. 17, 2000 (JP) ........................................ 2000-316254

(51) Int. Cl.$^7$ ................................................. B32B 9/00
(52) U.S. Cl. ...................................... 428/408; 428/195
(58) Field of Search ................................. 428/408, 195

(56) References Cited

U.S. PATENT DOCUMENTS 6,136,386 A * 10/2000 Nakahigashi et al.

FOREIGN PATENT DOCUMENTS

| JP | 03045595 | * | 2/1991 |
| JP | 06172087 | * | 6/1994 |

* cited by examiner

*Primary Examiner*—Archene Turner
(74) *Attorney, Agent, or Firm*—Finnegan, Henderson, Farabow, Garrett & Dunner, L.L.P.

(57) ABSTRACT

A carbon film C containing carbon as a main component, formed on the surface of a soft base material 4, characterized in that the film C is cracked A and divided into a plurality of regions B, and an average area of respective regions (blocks) surrounded by cracks A is $0.15 \times 10^{-3}$ mm$^2$ to $20 \times 10^{-3}$ mm$^2$.

5 Claims, 4 Drawing Sheets

CARBON FILM AND METHOD OF FORMING THE SAME

BACKGROUND OF THE INVENTION

1. Field of the Invention

The present invention relates to a carbon film to be formed on the surface of a soft base material such as rubber or plastic (for example, such a carbon film having characteristics as low friction coefficient or low wear, to be used to such as sliding portion of machine parts), and a method of forming the same.

2. Description of the Related Art

Being high in hardness, carbon film is much used to cover the surface of metallic base material demanded to have high hardness as tools or parts of vehicles.

The carbon film is also sometime covered on the surfaces of soft base material such as rubber or plastic. In these cases, if covering the carbon film on the surface of soft base material, it has a merit to decrease frictional resistance on the surface and provide high hardness as maintaining the flexibility of soft base material. For this fact, recently studies and developments have rapidly been advanced for covering the carbon film on the surfaces of soft base material.

For covering the carbon film on the surface of soft base material, for example, the soft base material is located within a closed film forming container, a gas containing carbon is introduced into the container, the gas is made plasma by use of means for making the gas plasma (for example, means as a high frequency discharge), and a carbon film containing carbon as a main component is formed on the surface of soft base material under the plasma.

The soft base material with carbon film formed thus is often used as a sliding member. For example, the soft base material covered with the carbon film is slid together with other article under pressure.

However, the sliding member composed of the soft base material with the carbon film is used under various circumstances. For example, in the sliding member, a predetermined pressure is loaded on the surface of the soft base material with the carbon film, and at this time, friction coefficient of the carbon film is demanded to be low for maintaining a function as the sliding member. For example, when pressure added to the surface of the carbon film on the soft base material is below a certain value, the friction coefficient of the carbon film is low and desirable; however, if being under pressure larger than this value, the friction coefficient of the carbon film is sometimes high, so that the function as the sliding member cannot be maintained.

Further, even if the carbon films are subject to the same pressure, there are cases that the friction coefficient is controlled to be low and controlled to be high.

SUMMARY OF THE INVENTION

Accordingly, it is an object of the invention to provide a carbon film containing carbon as a main component, formed on the surface of a soft base material, enabling to control friction coefficient to be low, and a method of forming this carbon film.

It is another object of the invention to provide a carbon film containing carbon as a main component, formed on the surface of a soft base material, where friction coefficient is controlled to be low in response to pressure to be applied to the surface of the carbon film.

It is a further object of the invention to provide a method of forming the carbon film containing carbon as a main component, formed on the surface of a soft base material, where friction coefficient is controlled to be low in response to pressure to be applied to the surface of the carbon film.

An inventor made studies for solving the problems, and obtained the following findings.

Namely, the carbon film containing carbon as the main component, formed on the surface of soft base material is divided by cracks into a plurality of regions. The carbon film may be produced by, for example, the following carbon film forming apparatus.

FIG. 3 of attached drawings shows an existing carbon film forming apparatus by Plasma CVD Process where methane gas is a raw gas.

This carbon film forming apparatus comprises a film forming container 1, a vacuum exhaust apparatus 2, a shower plate 3, and means for making plasma the gas (herein, a high frequency electrode 5 connected to a high frequency power source 8 via a matching box 7). The vacuum exhaust apparatus 2 enables to exhaust an air from an interior of the film forming container 1. The shower plate 3 introduces a gas containing carbon (herein, methane gas) into the film forming container 1 vacuum-exhausted by the vacuum exhaust apparatus 2. The means for making plasma the gas makes the gas introduced into the film forming container 1 through the shower plate 3 plasma. Incidentally, the high frequency electrode 5 may mount the soft base material 4 thereon. The high frequency electrode 5 is impressed the high frequency voltage from the high frequency power source 8 via the matching box 7. Thereby, the gas introduced into the container 1 is made plasma which is to be formed at a position shown with numeral 6 in the drawing.

In the carbon film forming apparatus shown in FIG. 3, the soft base material 4 is located on the high frequency electrode 5 in the film forming container 1, and the interior of the container 1 is closed. While the interior of the closed container 1 is vacuum-discharged by the vacuum exhaust apparatus 2, the methane gas ($CH_4$) is introduced as the raw gas from the shower plate 3, and the interior of the container 1 is maintained at a desired film forming pressure. In general, the pressure within the vacuum container 1 ranges 0.1 to 10 Pa. The high frequency electrode 5 mounting the soft base material 4 thereon is impressed with the high frequency voltage. Then, a methane gas plasma 6 is formed within the film forming container 1, and carbon being a composing element of methane is deposited on the soft base material 4. Thus, the carbon film is formed on the soft base material 4. By the way, the methane gas is employed as the raw gas, and when the carbon film is formed on the soft base material, benzene gas ($C_6H_6$) is generally used other than the methane gas.

FIG. 4 shows a schematically enlarged view of the surface condition of the carbon film grown by use of the methane gas or benzene gas.

Observing the surface of the grown carbon film by means of such as electron microscope, it is seen as shown in FIG. 4 that numberless cracks A appear in the film, and the film is finely divided into a plurality of regions B due to cracks A. Herein, each of regions B surrounded by cracks A in the carbon film shall be called as "block".

In a conventional film forming process of the carbon film employing the methane gas or benzene gas as the raw gas, when forming the carbon film on the soft base material, if changing conditions such as an electric power supplied in the formed film, the average area of the block B may be changed. When employing the methane gas as the raw gas, the average area of the block B ranges around $0.01\times10^{-3}$ mm$^2$ to 0.1 to $10^{-3}$ mm$^2$, and when the benzene gas is the raw gas, it ranges around $0.06\times10^{-3}$ mm$^2$ to 0.12 to $10^{-3}$ mm$^2$.

According to the inventor's studies, it was seen that if using a gas containing carbon as a raw gas to be introduced into a film forming chamber, which is higher molecular than that of benzene (for example, a hydrocarbon higher molecular than such as benzene), otherwise if using a gas containing oxygen atom and including carbon, or using a gas containing oxygen atom, which is added to the gas containing carbon, the average area of the block B might be controlled, so that the carbon film of larger average area of the block B might be obtained.

The inventor made further studies to investigate the relationship between the average area of the block B and the friction coefficient of the carbon film. It was found that a close correlation was present between them. That is, when the average range of the block B was smaller than around $0.15\times10^{-3}$ mm$^2$, roughness in the surface of the carbon film was large. When it was larger than around $20\times10^{-3}$ mm$^2$, the carbon film was finely cracked under pressure in the respective blocks B, resulting to be the surface roughness in the carbon film. In either way, the friction coefficient of the carbon film tended to be large. However, if the average area of the block B was around $0.15\times10^{-3}$ mm$^2$ to $20\times10^{-3}$ mm$^2$, the friction coefficient of the carbon film could be controlled to be low. In other words, it was found that if the range of the average area of the block B was selected from around $0.15\times10^{-3}$ mm$^2$ to $20\times10^{-3}$ mm$^2$ in response to the pressure to be applied to the surface of the carbon film, the friction coefficient of the carbon film might be controlled to be low.

In the conventional carbon film forming process using the methane gas or benzene gas as the raw gas, since the controlling range of the average area of the block B is narrow as $0.01\times10^{-3}$ mm$^2$ to $0.1\times10^{-3}$ mm$^2$ in the case of the methane gas, and $0.06\times10^{-3}$ mm$^2$ to $0.12\times10^{-3}$ mm$^2$ in the case of the benzene gas, it is not possible to fully take out the effect of controlling the friction coefficient of the carbon film to be low. However, if using a gas containing carbon as a raw gas to be introduced into the film forming chamber, which has a higher molecular weight than that of benzene (for example, a hydrocarbon higher molecular than such as benzene), otherwise if using a gas containing oxygen atom and including carbon, or using a gas containing oxygen atom, which is added to the gas containing carbon, it is possible to obtain a carbon film having a larger average area of the block (that is, the average area of around $0.15\times10^{-3}$ mm$^2$ to $20\times10^{-3}$ mm$^2$). Accordingly, it is possible to obtain such a carbon film where the friction coefficient is controlled to be low.

Based on the above mentioned findings, the invention is to provide the following carbon film and the method of forming the carbon film.

(1) The Carbon Film

A carbon film containing carbon as a main component, formed on the surface of a soft base material, wherein the film is cracked and divided into a plurality of regions, and an average area of respective regions surrounded by cracks is $0.15\times10^{-3}$ mm$^2$ to $20\times10^{-3}$ mm$^2$.

(2) The Method of Forming the Carbon Film

A method of forming a carbon film, wherein a soft base material is located within a closed film forming container, a gas containing carbon is introduced into the container, the gas is made plasma by use of means for making the gas plasma, and a carbon film containing carbon as a main component is formed on the surface of a soft base material under the plasma, said film being cracked and divided into a plurality of regions, and having an average area of respective regions surrounded by cracks being $0.15\times10^{-3}$ mm$^2$ to $20\times10^{-3}$ mm$^2$.

In the carbon film and the method of forming the same according to the invention, the average area of the respective regions (block) surrounded by cracks are obtained as follows.

Namely, with respect to each of five parts of the same area (500 $\mu$m$\times$500 $\mu$m=0.25 mm$^2$) arbitrarily selected in the carbon film, enlarged observation of 250 magnifications by SEM (the scanning type electron microscope) is carried out to count piece number of blocks in the area, and the area (0.25 mm$^2$) of the each part is divided by the piece number of the block so as to demand the block area, and as to the thus demanded five parts, the average value of the block area is obtained to be average area of the block.

According to the carbon film by the invention, since the average area of the respective regions surrounded by cracks is $0.15\times10^{-3}$ mm$^2$ to $20\times10^{-3}$ mm$^2$, the friction coefficient of the carbon film is controlled to be low. To further say, the friction coefficient may be controlled to be low also in a mutual dry-sliding between the carbon film and other article, not using lubricant as an oil.

The soft base material may be such a material to be slid together with other article under pressure or under a dried condition not interposing the lubricant as an oil. In this case, as optimum ranges of the average area of the respective regions surrounded by cracks where the friction coefficient of the carbon film is controlled to be low in response to pressure to be applied to the surface of the carbon film, there are exemplified around $0.15\times10^{-3}$ mm$^2$ to $20\times10^{-3}$ mm$^2$ when the soft base material is to be slid together with the other article under pressure below $8\times10^5$ Pa; around $0.15\times10^{-3}$ mm$^2$ to $4\times10^{-3}$ mm$^2$ when the soft base material is to be slid together with the other article under pressure from $8\times10^5$ Pa to $4\times10^6$ Pa; and around $0.15\times10^{-3}$ mm$^2$ to $2\times10^{-3}$ mm$^2$ when the soft base material is to be slid together with the other article under pressure above $4\times10^6$ Pa.

The method of forming the carbon film according to the invention can produce the carbon film of the invention. As to the carbon film produced by the method of forming the carbon film according to the invention, the same as mentioned above concerning the carbon film of the invention may be referred to.

In the film forming method of the invention, the soft base material is located within the closed film forming container, the gas containing carbon is introduced into the container, the gas is made plasma by use of means for making the gas plasma, and such a carbon film is formed on the surface of the soft base material under the plasma, that the average area of the respective regions surrounded by cracks is $0.1\times10^{-3}$ mm$^2$ to $20\times10^{-3}$ mm$^2$.

According to the carbon film forming method of the invention, as the carbon film to be formed has the average area of the respective regions surrounded by cracks being $0.15\times10^{-3}$ mm$^2$ to $20\times10^{-3}$ mm$^2$, it is possible to obtain the carbon film of the friction coefficient being controlled to be low.

The carbon film forming method of the invention may employ any in the following exemplified gases in (a) to (c), whereby it is possible to obtain the carbon film having the average area of the respective regions surrounded by cracks being $0.15\times10^{-3}$ mm$^2$ to $20\times10^{-3}$ mm$^2$.

(a) As examples of hydrocarbon gas having higher molecular weight than that of benzene, exemplified are gases, molecular symbols of which are expressed with C$x$H$y$ (X$\geq$6 and $Y \geq 7$), for example, $C_6H_{12}$ (cyclohexane) gas, $C_6H_{14}$ (hexane) gas or $C_8H_{18}$ (octane) gas.

(b) As examples of gases containing oxygen atom and carbon atom, gases expressed with molecular symbols of CxHyOz may be exemplified. Herein, x, y, z are respectively integers or 1 or more. As more actual examples, exemplified are $x \geq 1$, $y \geq 2$ and $z \geq 1$. Practically, $CH_3OH$ (methanol) gas, $C_2H_5OH$ (ethanol) gas and $CH_3COCH_3$ (acetone) gas are exemplified.

(c) As an example of a gas containing oxygen atom, which is added to a gas containing carbon, there are exemplified a mixture of a raw gas containing carbon and a gas of a main component being metallic oxide or a gas of a main component being silicone oxide. Practically, a mixture of $CH_4$ (methane) gas or $C_6H_6$ (benzene) gas and a gas of a main component being $TiO_2$ (titanium oxide); or a mixture of $CH_4$ (methane) gas or $C_6H_6$ (benzene) gas and a gas of a main component being TEOS (tetraethoxysilane). In this case, as a gas containing carbon, in substitution for methane gas or benzene gas, a gas of CxHy ($X \geq 6$ and $Y \geq 7$) may be employed.

Either way, in the carbon film and the carbon film forming method according to the invention, as the soft base material, for example, a rubber base material such as silicone rubber or plastic base material are enumerated though being not limited to.

DETAILED DESCRIPTION OF THE PREFERRED EMBODIMENT

An embodiment of the invention will be explained with reference to the attached drawings.

Figure 1:
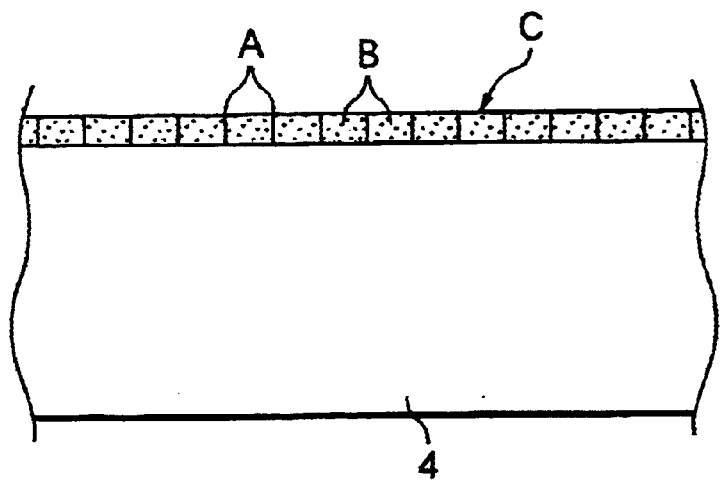
FIG. 1 is a schematically cross sectional view of one part of the soft base material forming a carbon film according to the invention.
Figure 2:
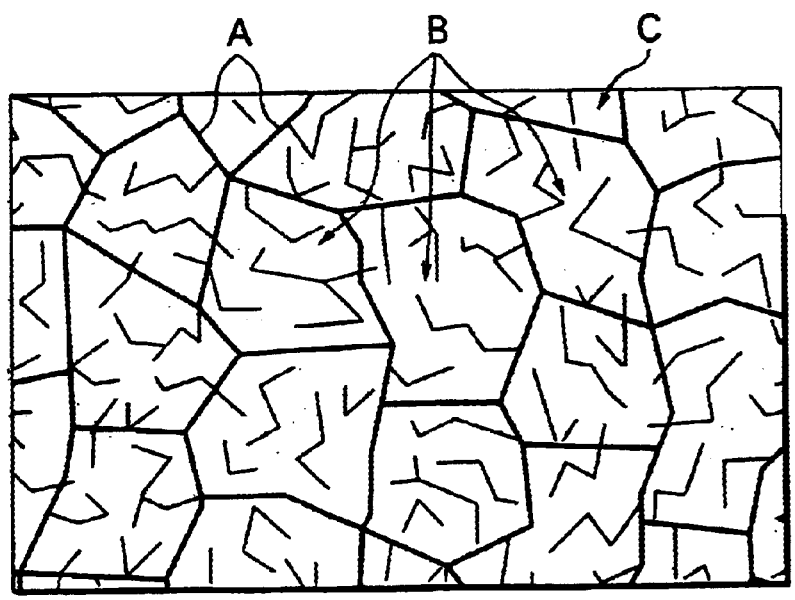
FIG. 2 is an schematically enlarged view of the surface condition of the carbon film shown in FIG. 1.

FIG. 1 is an schematically cross sectional view of one part in the soft base material forming the carbon film according to the invention. FIG. 2 is an schematically enlarged view of the surface condition of the carbon film shown in FIG. 1.

The carbon film C shown in FIG. 1 is a film having carbon as the main component formed on the surface of the soft base material 4 (herein, silicone rubber). The soft base material 4 formed with the carbon film C is served as a sliding member.

The carbon film C is divided into a plurality of regions B by cracks A as seen in FIG. 2. The average area of the respective regions B (called as "block" hereafter) surrounded with cracks A is within predetermined ranges.

The average value of the block B is obtained in such a manner that with respect to each of five parts of the same area (50 $\mu$m×50 $\mu$m=0.25 mm$^2$) arbitrarily selected in the carbon film, the enlarged observation of 250 magnifications by SEM (the scanning type electron microscope) is carried out to count piece number of blocks in the area; the area (0.25 mm$^2$) of the each part is divided by the piece number of the block for demanding the block area; and as to the thus demanded five parts, the average value of the block area is obtained to be average area of the block B.

As mentioned above, there is the close correlation between the average area of the block B surrounded with cracks A and the friction coefficient of the carbon film.

Figure 5A:
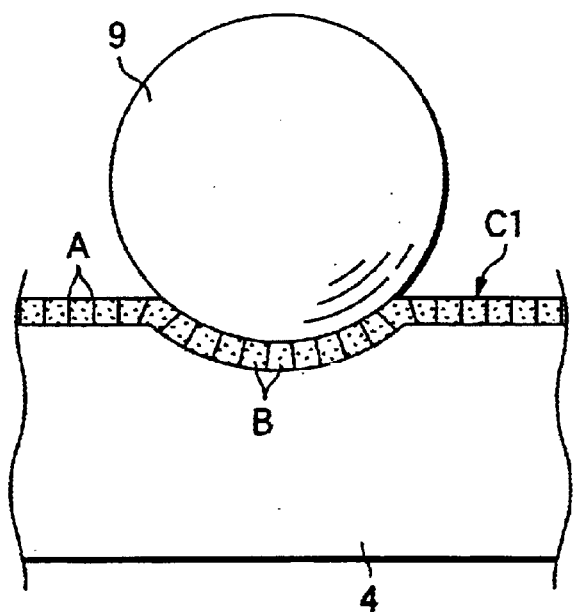
FIG. 5A is a schematically cross sectional view showing an example where the soft base material formed with the carbon film having relatively small average area of the block is slid together with a rigid body ball.
Figure 5B:
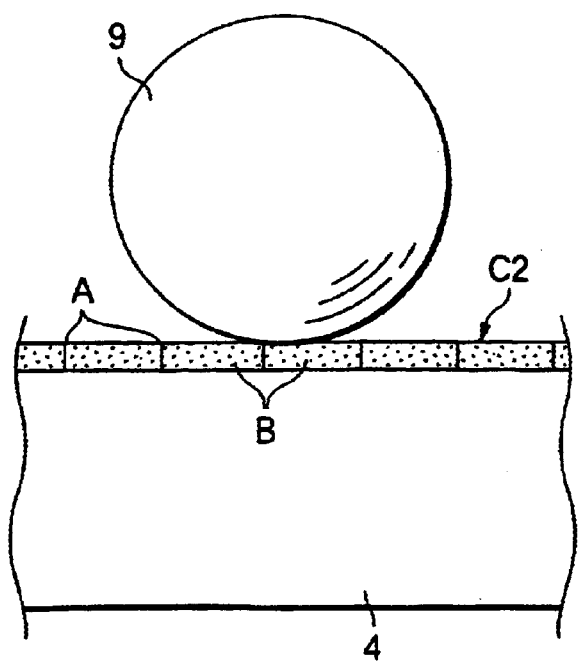
FIG. 5B is a schematically cross sectional view showing an example where the soft base material formed with the carbon film having relatively large average area of the block is slid together with the rigid body ball.

FIG. 5A schematically shows an example where the soft base material 4 formed with the carbon film C1 having relatively small average area of the block B is slid together with the other article 9 (herein, a rigid body ball). FIG. 5B schematically shows an example where the soft base material 4 formed with the carbon film C2 having relatively large average area of the block B is slid together with the other article 9 (herein, the rigid body ball).

When the average area of the block B is relatively small, the rigid body ball 9 sinks into the soft base material 4 as shown in FIG. 5A. That is, the smaller the average area of the block B, the larger the contacting area between the rigid body ball and the carbon film, and the more cracks A to be resistance, resulting in that the frictional resistance of the carbon film C1 is large. In contrast, when the average area of the block B is relatively large, as shown in FIG. 5B, the larger the average area of the block B, the smaller the frictional resistance. This shows that the carbon film C2 is a good film as the covering film of the sliding member. However, if the average area is too large, the carbon film C2 is broken due to load from the rigid body ball 9, and the cracks A increase so that the friction coefficient of the carbon film C2 reversely comes up. To actually say it, when the average area of the block B is smaller than around 0.15×10$^{-3}$ mm$^2$, and larger than around 20×10$^{-3}$ mm$^2$, the friction coefficient of the carbon film trends to become large. If selecting the average area of the block B from around 0.15×10$^{-3}$ mm$^2$ to 20×10$^3$ mm$^2$, the friction coefficient of the carbon film can be controlled to be low in response to pressure to be applied to the surface of the carbon film.

To further say, the optimum ranges of the average area of the block B where the friction coefficient of the carbon film is controlled to be low in response to pressure to be applied to the surface of the carbon film, are around 0.15×10$^{-3}$ mm$^2$ to 20×10$^{-3}$ mm$^2$ when the soft base material 4 is to be slid together with the rigid body ball 9 under pressure below 8×10$^5$ Pa; are around 0.15×10$^{-3}$ mm$^2$ to 4×10$^{-3}$ mm$^2$ when the soft base material 4 is to be slid together with the rigid body ball 9 under pressure from 8×10$^5$ Pa to 4×10$^6$ Pa; and are around 0.15×10$^{-3}$ mm$^2$ to 2×10$^{-3}$ mm$^2$ when the soft base material 4 is to be slid together with the rigid body ball 9 under pressure above 4×10$^6$ Pa.

Herein, the average area of the block B in the carbon film is within the range of 0.15×10$^{-3}$ mm$^2$ to 20×10$^{-3}$ mm$^2$, and the friction coefficient of the carbon film C is controlled to be low.

Further reference will be made to the carbon film forming method according to the invention. The carbon film forming method according to the invention produces such the carbon film of the invention that the carbon film C is divided into the plurality of regions B by cracks A and has the average area of the respective regions B (block) surrounded by cracks A being $0.15\times10^{-3}$ mm$^2$ to $20\times10^{-3}$ mm$^2$.

Figure 3:
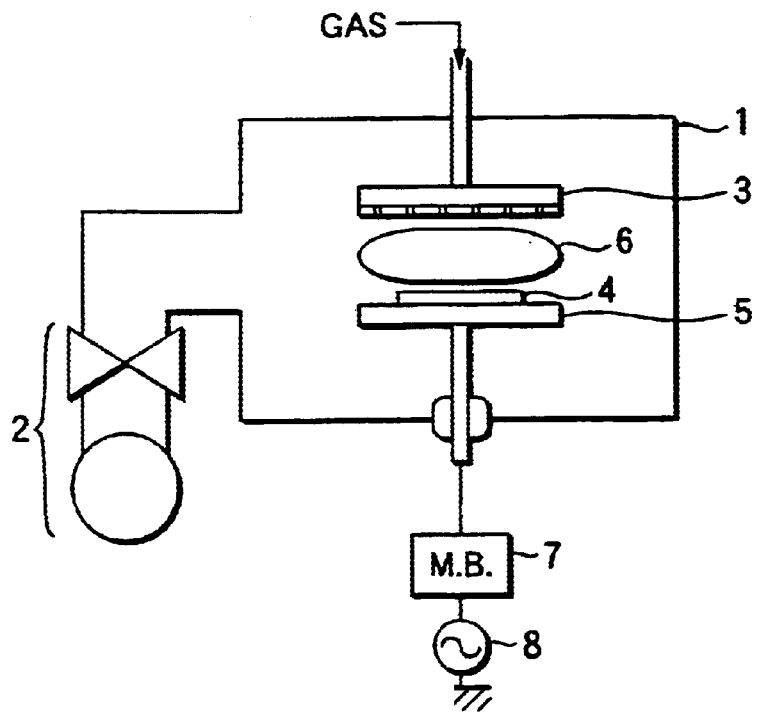
FIG. 3 is a side view showing a carbon film forming apparatus.
Figure 4:
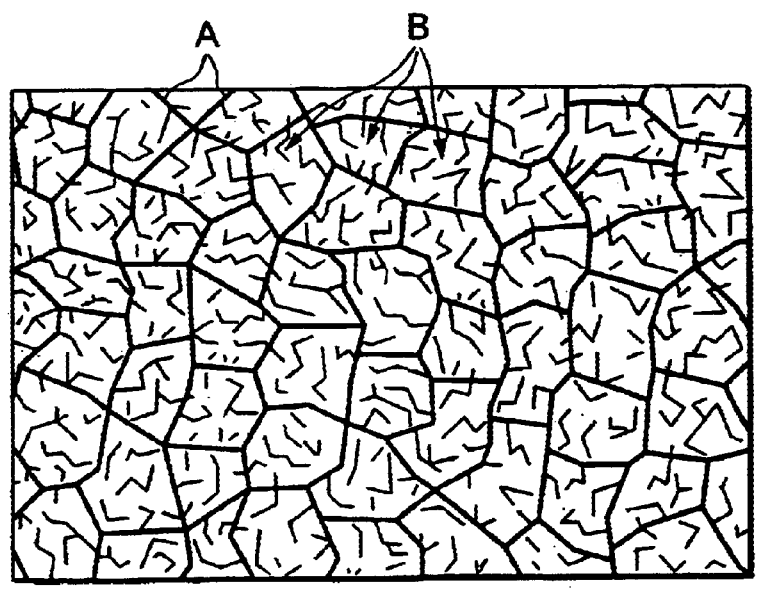
FIG. 4 is a drawing schematically showing the enlarged view of the surface condition of the carbon film formed by use of the methane gas or the benzene has as the raw gas.

A film forming apparatus for practicing the inventive method is, for example, the carbon film forming apparatus shown in FIG. 3 which uses, as the raw gas in substitution for the conventional gases (methane gas or benzene gas), a gas containing carbon and having higher molecular weight than that of benzene, a gas containing oxygen atom and including carbon, or a gas containing oxygen atom, which is added to the gas containing carbon.

This film forming apparatus employs any in the following gases in (a) to (c), whereby it is possible to control the average area of the block B to be within the range of around $0.15\times10^{-3}$ mm$^2$ to $20\times10^{-3}$ mm$^2$.

(a) Gases, molecular symbols of which are expressed with CxHy ($X \geq 6$ and $Y \geq 7$), for example, $C_6H_{12}$ (cyclohexane) gas, $C_6H_{14}$ (hexane) gas or $C_8H_{18}$ (octane) gas. (b) Gases, molecular symbols of which are expressed with CxHyOz ($x \geq 1$ and $y \geq 2$ and $z \geq 1$) Practically, $CH_3OH$ (methanol) gas, $C_2H_5OH$ (ethanol) gas and $CH_3COCH_3$ (acetone) gas. (c) A mixture of a raw gas containing carbon and a gas of a main component being metallic oxide or a gas of a main component being silicone oxide. Practically, a mixture of $CH_4$ (methane) gas or $C_6H_6$ (benzene) gas and a gas of a main component being $TiO_2$ (titanium oxide); or a mixture of $CH_4$ (methane) gas or $C_6H_6$ (benzene) gas and a gas of a main component being TEOS (tetraethoxysilane).

In the carbon film forming apparatus, as shown in FIG. 3, the soft base material 4 is located on the high frequency electrode 5 in the film forming container 1, and the interior of the container 1 is closed. While the interior of the closed container 1 is vacuum-exhausted by the vacuum exhaust apparatus 2, any gas of the above (a) to (c) is introduced as the raw gas from the shower plate 3, and the interior of the container 1 is maintained at a desired film forming pressure. In general, the pressure within the vacuum container 1 ranges herein 0.1 to 10 Pa. The high frequency electrode 5 mounting the soft base material 4 is impressed with the high frequency voltage. Then, the gas is decomposed and a gas plasma 6 is formed within the film forming container 1, and carbon as a composing element of a gas molecule is deposited on the soft base material 4. Thus, the carbon film C is formed on the soft base material 4, which carbon film is divided by cracks A into the plurality of regions, and has the low friction coefficient having the average area of the respective regions B (block) surrounded by cracks A being $0.15\times10^{-3}$ mm$^2$ to $20\times10^3$ mm$^2$.

Next, explanation will be made to actually Examples forming the inventive carbon film on the soft base material by use of the apparatus of FIG. 3 and examples of the resulted carbon films together with comparative Examples.

A plurality of silicone rubbers (Young's modulus: $1\times10^6$ Pa and thickness: 2 mm) were prepared as the soft base material, and the carbon films of 1 $\mu$m thickness were formed on the surfaces of the respective soft base materials by changing kinds of the raw gases. Observing the surface conditions of the carbon films formed on the surfaces of the respective soft base materials, the average areas of the carbon film blocks were measured.

The average value of the block B is obtained in such a manner that with respect to each of five parts of the same area (500 $\mu$m$\times$500 $\mu$m=0.25 mm$^2$) arbitrarily selected in the carbon film, the enlarged observation of 250 magnifications by SEM (the scanning type electron microscope is carried out to count piece number of blocks in said area; the area (0.25 mm$^2$) of the each parts is divided by the piece number of the block for demanding the block area; and as to the thus demanded five parts, the average value of the block area is obtained to be average area of the block.

In the following Examples 1 to 8, the raw gases were the mixture of $C_6H_{12}$ (cyclohexane) gas, $C_6H_{14}$ (hexane) gas, $C_8H_{18}$ (octane) gas, $CH_3OH$ (methanol) gas, $C_2H_5OH$ (ethanol) gas, $CH_3COCH_3$ (acetone) gas, a mixture of $CH_4$ (methane) gas and a gas of a main component being TEOS (tetraethoxysilane), or the mixture of $C_6H_6$ (benzene) gas and a gas of a main component being TEOS (tetraethoxysilane).

In the comparative experiments 1 and 2, as the raw gases, $CH_4$ (methane) gas and $C_6H_6$ (benzene) gas were used respectively.

Measured results are shown under.

|  | Introduced gases | Average areas of blocks |
| --- | --- | --- |
| Comparative Ex. 1 | $CH_4$ | $0.05 \times 10^{-3}$ mm$^2$ |
| Comparative Ex. 2 | $C_6H_6$ | $0.1 \times 10^{-3}$ mm$^2$ |
| Ex. 1 | $C_6H_{12}$ | $2 \times 10^{-3}$ mm$^2$ |
| Ex. 2 | $C_6H_{14}$ | $5 \times 10^{-3}$ mm$^2$ |
| Ex. 3 | $C_8H_{18}$ | $8 \times 10^{-3}$ mm$^2$ |
| Ex. 4 | $CH_3OH$ | $4 \times 10^{-3}$ mm$^2$ |
| Ex. 5 | $C_2H_5OH$ | $10 \times 10^{-3}$ mm$^2$ |
| Ex. 6 | $CH_3COCH_3$ | $8 \times 10^{-3}$ mm$^2$ |
| Ex. 7 | $CH_4$ and TEOS | $0.15 \times 10^{-3}$ mm$^2$ |
| Ex. 8 | $C_6H_6$ and TEOS | $1 \times 10^{-3}$ mm$^2$ |

In comparison with the Comparative Examples 1 and 2 of forming the carbon films by use of $CH_4$ (methane) gas and $C_6H_6$ (benzene) gas as the raw gas, if forming the carbon films by use of $C_6H_{12}$ (cyclohexane) gas, $C_6H_{14}$ (hexane) gas, $C_8H_{18}$ (octane) gas in Examples 1–3, which is a gas containing carbon as raw gas and has the higher molecular material than that of benzene, the average areas of the blocks are large. This is assumed that carbon contained in the raw gas is taken in the film under a condition where carbon is at a small degree of dissociation in the plasma and is not decomposed sufficiently (that is, under a condition of large network attaching several carbons).

Likely the Examples 4 to 6, if forming the carbon films by use of alcohol gas such as $CH_3OH$ (methanol) gas containing oxygen atom as the raw gas, and also likely the Examples 7 and 8, if forming the carbon films by use of a gas, as the raw gas, containing silicone oxide like TEOS (tetraethoxysilane), which is added to a gas containing carbon, the values of the average areas of the blocks are larger than those of the Comparative Examples 1 and 2. This is assumed that carbon contained in the raw gas is taken in the film under a condition where carbons are combined by inclusion of oxygen).

With respect to the carbon films obtained in the Examples 1 to 8, the friction coefficients of the carbon films were measured, after predetermined times passed, by means of a rotating sliding test apparatus, by sliding the rigid body balls (Zr balls) at loads of 5, 20 and 100 g as drawing circles on the carbon films. The apparatus and the conditions for measuring are as follows.

| Aparatus: | Friction Player made by (K.K.) Lesca Model No. FRP-2000 |
| --- | --- |
| Measuring conditions: | |
| Quality of rigid body ball: | Zirconium oxide |
| Diameter of rigid ball: | 5 mm |

-continued

Figure 6:
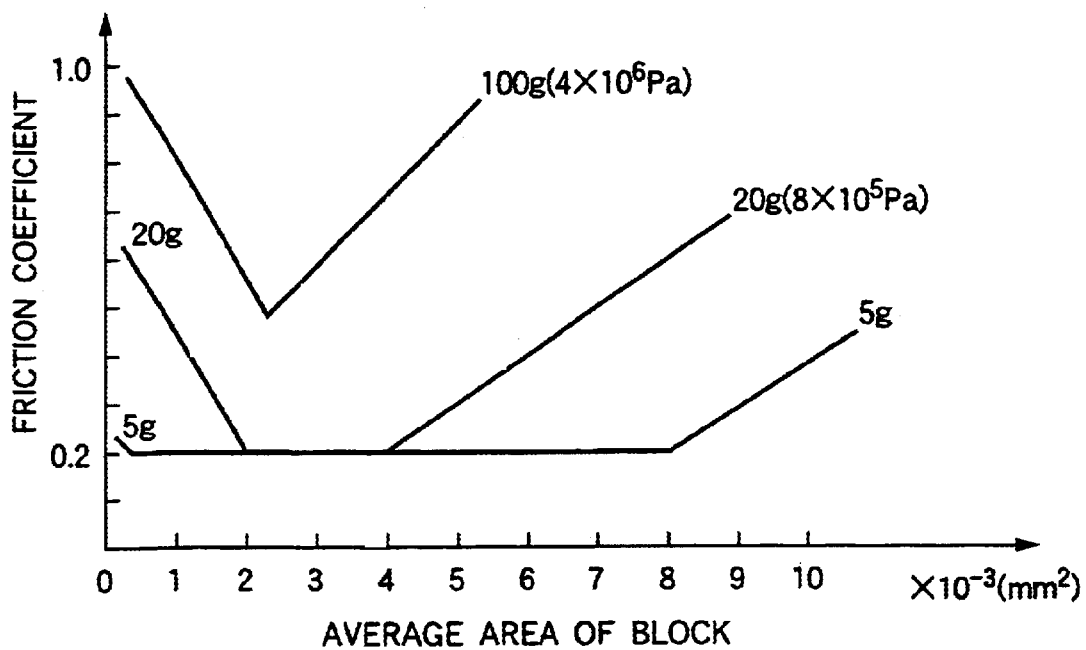
FIG. 6 is a view showing the friction coefficients of the carbon films with respect to the carbon films obtained in the Examples 1 to 8.

Radius of circular motion:  5 cm
Speed of circular motion:   10 cm/sec
Sliding time:               1 hour The average areas of the blocks were on the axis of abscissa in FIG. 6 and the friction coefficients of the carbon films were on the axis of ordinate, and the results are as shown in the same.

As seen in FIG. 6, when sliding the rigid body ball at load of, e.g., about 20 g, and until the average area of the block is around $2 \times 10^{-3}$ mm$^2$, the larger the average area of the block, the lower the friction coefficient of the carbon film, and until the average area of the block is around $4 \times 10^{-3}$ mm$^2$, the optimum condition of the friction coefficient being low is kept. However, when the average area of the block is $5 \times 10^{-3}$ mm$^2$ or more, the friction coefficient of the carbon film reversely goes up. When the surface of the carbon film at that time, it was found that many cracks appeared at the sliding part between the carbon film and the rigid body ball.

When sliding the rigid body ball at lighter load as 5 g, the optimum condition of the friction coefficient of the carbon film being low is kept (showing the low friction coefficient) in the wide range of the average area of the block is $8 \times 10^{-3}$ mm$^2$ or lower. However, when the average area of the block is $8 \times 10^{-3}$ mm$^2$ or more, the friction coefficient of the carbon film still goes up.

Further, when sliding the rigid body ball at heavy load as about 100 g, the friction coefficient of the carbon film is large as a whole, but it is seen that similar tendency to the above mentioned appears.

The sliding widths when sliding the rigid body ball at loads of 20 and 100 g were around 0.5 mm in both. That is, the loads of 20 and 100 g respectively correspond to about $8 \times 10^5$ Pa and about $4 \times 10^6$ Pa.

As mentioned above, in the carbon film according to the invention, in case the soft base material formed with the carbon film is served as the sliding member, if the average area of the block is within the predetermined range, the optimum friction and sliding characteristic are available.

In the existing carbon film forming process using the methane gas or the benzene gas as the raw gas, since the controlling range of the average area of the block is narrow as mentioned above, such an effect could not be enough taken out which controlled the friction coefficient of the carbon film to be low. However, since the carbon film forming method according to the invention uses, as the raw gas, a gas containing carbon and having the higher molecular material than that of benzene, a gas containing oxygen atom and containing carbon, or a gas containing oxygen atom, which is added to a gas containing carbon, it is possible to obtain the carbon film having the larger average area of the block (that is, the average areas of around $0.15 \times 10^{-3}$ mm$^2$ to $20 \times 10^{-3}$ mm$^2$). Accordingly the carbon films having the optimum friction and sliding characteristic are available.

As mentioned above, in accordance with the invention, it is possible to provide the carbon film containing carbon as the main component, formed on the surface of the soft base material, enabling to control friction coefficient to be low, and a method of forming this carbon film.

Further, according to the invention, it is possible to provide the carbon film containing carbon as the main component, formed on the surface of the soft base material, enabling to control the friction coefficient in response to pressure to be applied to the surface of the carbon film.

Still further, according to the invention, it is possible to provide the method of forming the carbon film containing carbon as the main component, formed on the surface of the soft base material, controlling the friction coefficient in response to pressure to be applied to the surface of the carbon film.

What is claimed is:

1. A carbon film containing carbon as a main component, formed on a surface of a soft base material, wherein the film is cracked and divided into a plurality of regions, and an average area of respective regions surrounded by cracks is $0.15 \times 10^{-3}$ mm$^2$ to $20 \times 10^{-3}$ mm$^2$.

2. The carbon film as set forth in claim 1, wherein the carbon film is formed on the surface of the soft base material to be slid together with other article under pressure below $8 \times 10^5$ Pa.

3. The carbon film as set forth in claim 1, wherein the carbon film is formed on the surface of the soft base material to be slid together with other article under pressure of $8 \times 10^5$ Pa to $4 \times 10^6$ Pa, and the average area of the respective regions surrounded by cracks is $0.15 \times 10^{-3}$ mm$^2$ to $4 \times 10^{-3}$ mm$^2$.

4. The carbon film as set forth in claim 1, wherein the carbon film is formed on the surface of the soft base material to be slid together with other article under pressure of $4 \times 10$ Pa or more, and the average area of the respective regions surrounded by cracks is $0.15 \times 10^{-3}$ mm$^2$ to $2 \times 10^{-3}$ mm$^2$.

5. The carbon film as set forth in claim 1, wherein the soft-based material is one of a rubber based material and a plastic based material.

* * * * *